United States Patent
Kang et al.

(10) Patent No.: US 7,760,556 B2
(45) Date of Patent: Jul. 20, 2010

(54) DATA PATH CIRCUIT IN A FLASH MEMORY DEVICE

(75) Inventors: Won Kyung Kang, Seoul (KR); Eui Suk Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/958,372

(22) Filed: Dec. 17, 2007

(65) Prior Publication Data

US 2008/0266950 A1   Oct. 30, 2008

(30) Foreign Application Priority Data

Apr. 27, 2007   (KR)   ...................... 10-2007-0041416

(51) Int. Cl.
*G11C 11/34* (2006.01)
(52) U.S. Cl. .............................. 365/189.05; 365/230.06
(58) Field of Classification Search ............ 365/189.05, 365/230.06
See application file for complete search history.

(56) References Cited

U.S. PATENT DOCUMENTS

| | | | | |
|---|---|---|---|---|
| 4,037,094 A | * | 7/1977 | Vandierendonck | .......... 708/231 |
| 4,144,550 A | * | 3/1979 | Donohue et al. | .............. 399/77 |
| 4,255,789 A | * | 3/1981 | Hartford et al. | ............. 701/108 |
| 4,686,480 A | * | 8/1987 | Katto et al. | .................. 327/176 |
| 4,727,468 A | * | 2/1988 | Maekawa | ..................... 363/41 |
| 6,262,924 B1 | * | 7/2001 | Fukutani et al. | ............. 365/200 |
| 7,019,506 B2 | * | 3/2006 | Kernahan | .................... 323/284 |
| 7,132,854 B1 | | 11/2006 | Chen et al. | |
| 7,299,400 B2 | * | 11/2007 | Yusa | .......................... 714/764 |

FOREIGN PATENT DOCUMENTS

JP   2000-244293   9/2000

* cited by examiner

*Primary Examiner*—Michael T Tran
(74) *Attorney, Agent, or Firm*—Townsend and Townsend and Crew LLP

(57) ABSTRACT

A data output circuit in an NAND flash memory device is disclosed. The data path circuit in a flash memory includes at least one switching means configured to output one or more internal address signals in accordance with a data output control signal, and one or more data output circuit configured to output data when a specific internal address signal is outputted through the switching means.

15 Claims, 5 Drawing Sheets

DATA PATH CIRCUIT IN A FLASH MEMORY DEVICE

CROSS-REFERENCE TO RELATED APPLICATIONS

This application claims priority from Korean Patent Application No. 2007-41416, filed on Apr. 27, 2007, the contents of which are incorporated herein by reference in its entirety.

BACKGROUND OF THE INVENTION

The present invention relates to a data path circuit in a NAND flash memory device. More particularly, the present invention relates to a data path circuit in a NAND flash memory device for reducing power consumed by a data output circuit when data are inputted.

Flash memory is a non-volatile memory for electrically erasing and programming data, and has the advantage of a random access memory RAM where data are freely written and erased and the advantage of a read only memory ROM where data can be maintained without a continuous power source. Hence, the flash memory has been widely used as a storage device for portable electrical devices such as a digital camera, a personal digital assistant PDA, and an MP3 player, etc.

A NAND flash memory device is a type of flash memory device, and includes a memory cell array, a row decoder and a page buffer.

The memory cell array has a plurality of word lines extended along rows, a plurality of bit lines extended along columns and a plurality of cell strings corresponding to the bit lines.

The NAND flash memory device performs a program operation for storing data in the memory cell array.

The program operation is divided into a command and address input interval, a data input interval and a third interval for programming inputted data in a memory cell array.

FIG. 1 is a block diagram illustrating a data input circuit in a common NAND flash memory device.

In FIG. 1, data inputted from an outside device (not shown) for program are temporarily stored in an input register (not shown), and then transmitted from the input register to a given circuit in the NAND flash memory device by a data input circuit 110. The transmitted data are provided to a page buffer (not shown) for the program operation of the NAND flash memory device.

FIG. 1 shows only the data input circuit 110 in the NAND flash memory device.

Generally, two 8 bit registers (first and second registers) are used to store the inputted 16 bit data.

The data input circuit 110 outputs in turn the data stored in the registers through two 8 bit data buses by using clocks CK_UP_LO and CK_UP_HI.

As mentioned above, the data are inputted from an outside device to the data input circuit 110 in FIG. 1 during the data input interval when the program operation is performed.

The flash memory device has a data input bus and a data output bus and uses a multiplex IO method for sharing a data input/output pad with these two buses. Accordingly, only the data input bus is used in the program operation. However, since the column address is connected to the data input bus and the data output bus, the data output bus performs a switching operation in response to a column address signal.

That is, a data output circuit for outputting data in the flash memory device operates even when the data output circuit does not have to operate while the data are inputted.

An internal address is changed in accordance with the toggle of an input control signal WE (write enable) and a read control signal RE (read enable), and so blocks related to the output of data switch the data output bus for output of data.

FIG. 2 is a timing diagram illustrating signals in the NAND flash memory device when data are inputted.

As shown in FIG. 2, signals 220 for output of data are activated in an operation interval 210 of an input register, wherein data are inputted during the operation interval 210.

In other words, an output operation of data does not have to be performed during the data input interval in the NAND flash memory device. However, in the common NAND flash memory device, the data output bus performs the switching operation during the data input interval. As a result, power is unnecessarily consumed.

SUMMARY OF THE INVENTION

The present invention relates to the control of a data path circuit in an NAND flash memory device so that a data output circuit is not operated during a data input interval for a program operation.

In one embodiment, a data input/output control circuit in a flash memory includes at least one switching unit configured to output one or more internal address signals in accordance with a data output enable signal. One or more data output circuits are configured to output data when a specific internal address signal is outputted by the switching unit. The input/output control circuit is provided between an input/output path control circuit and a data pad. The input/output control circuit is configured to process data flow between the input/output path control circuit and the data pad.

In one embodiment, a flash memory includes first and second sub-page buffer circuits coupled to first and second planes, respectively. First and second sub-IO path control circuits are configured to control data being input and output to the first and second sub-page buffer circuits, the first and second sub-IO path control circuits being associated with the first and second sub-page buffer circuits, respectively. An input/output control circuit is configured to process data flow between an input/output pad and the first and second sub-IO path control circuits. The input/output control circuit includes a first data output circuit and a first switch circuit coupled to the first data output circuit. The first switching unit is configured to output a first address signal according to a first data output enable signal. The input/output control circuit is configured to disable the first data output enable signal during a data input period, so that the first address signal is not inputted to the first data output circuit.

Other embodiments of the inventions are described below. A data path circuit in a flash memory according to one example embodiment of the present invention includes at least one switching means configured to output one or more internal address signals in accordance with a data output control signal; and one or more data output circuit configured to output data when a specific internal address signal is outputted through the switching means.

The switching means is a three phase inverter circuit for outputting the internal address signals when the data output signal is enabled and outputting a final output value when the data output signal is disabled.

The data output circuit includes a plane output multiplexer configured to select one of planes in accordance with a first control signal, and output data of the selected plane; a data output multiplexer configured to output selectively an output signal and control data of the plane output multiplexer in accordance with a second control signal; a scramble output multiplexer configured to output dividedly data outputted from the data output multiplexer into one or more data bus in accordance with a third control signal; and a multi-data output multiplexer configured to transmit a signal of the data bus outputted from the scramble output multiplexer to a data output pad in accordance with a data read signal.

The first control signal is a plane select signal.

The second control signal is a first internal address signal inputted in accordance with the data output control signal.

The third control signal is a second internal address signal inputted in accordance with the data output control signal.

The data output control signal is disabled during input operation of data.

A data path circuit in a flash memory device according to another example embodiment of the present invention includes a data input path through which data are inputted; a data output path through which data are outputted; and a controller configured to cut off the data input path and activate the data output path in a data output interval, and activate the data input path and cut off the data output path in a data input interval.

The data path circuit further includes a switching means configured to switch the data input path and the data output path in accordance with control of the controller.

The switching means is a three phase inverter circuit for outputting an internal address inputted to the data output path when data are outputted and cut off output of the internal address when data are inputted.

The switching means is a three phase inverter circuit for outputting an internal address inputted to the data input path when data are inputted and cut off output of the internal address when data are outputted.

As described above, a data path circuit in a flash memory device of the present invention controls input of an internal address signal by using a control signal during a data input interval so that a multiplexer of a data output circuit is not operated. As a result, a power may not be unnecessarily consumed.

DESCRIPTION OF SPECIFIC EMBODIMENTS

Hereinafter, the embodiments of the present invention will be explained in more detail with reference to the accompanying drawings.

Figure 1:
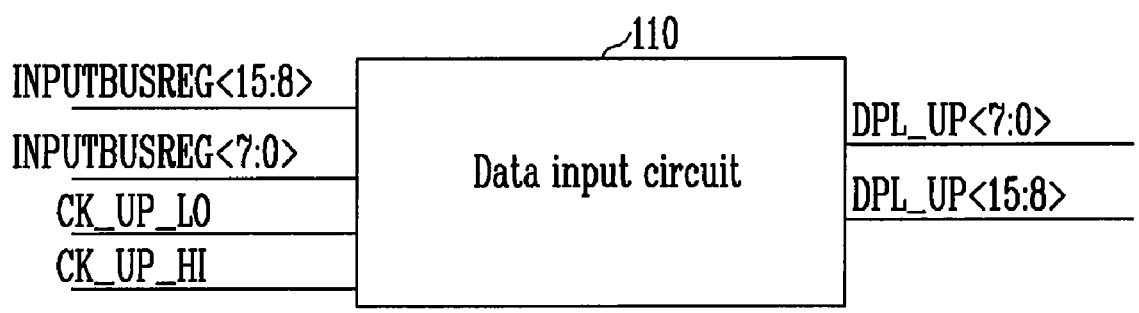
FIG. 1 is a block diagram illustrating a data input circuit in a common NAND flash memory device.
Figure 2:
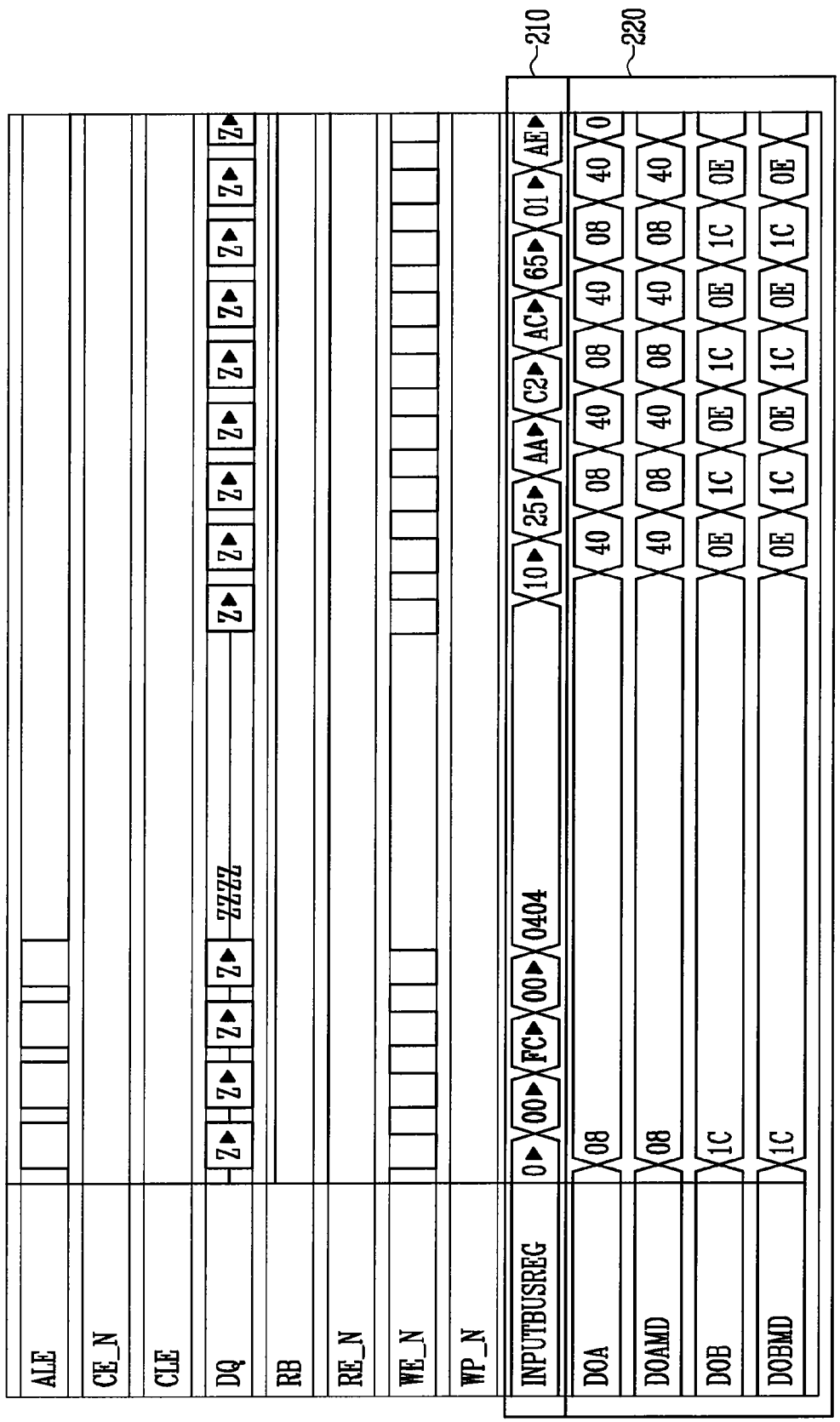
FIG. 2 is a timing diagram illustrating signals in the NAND flash memory device when data are inputted.
Figure 3A:
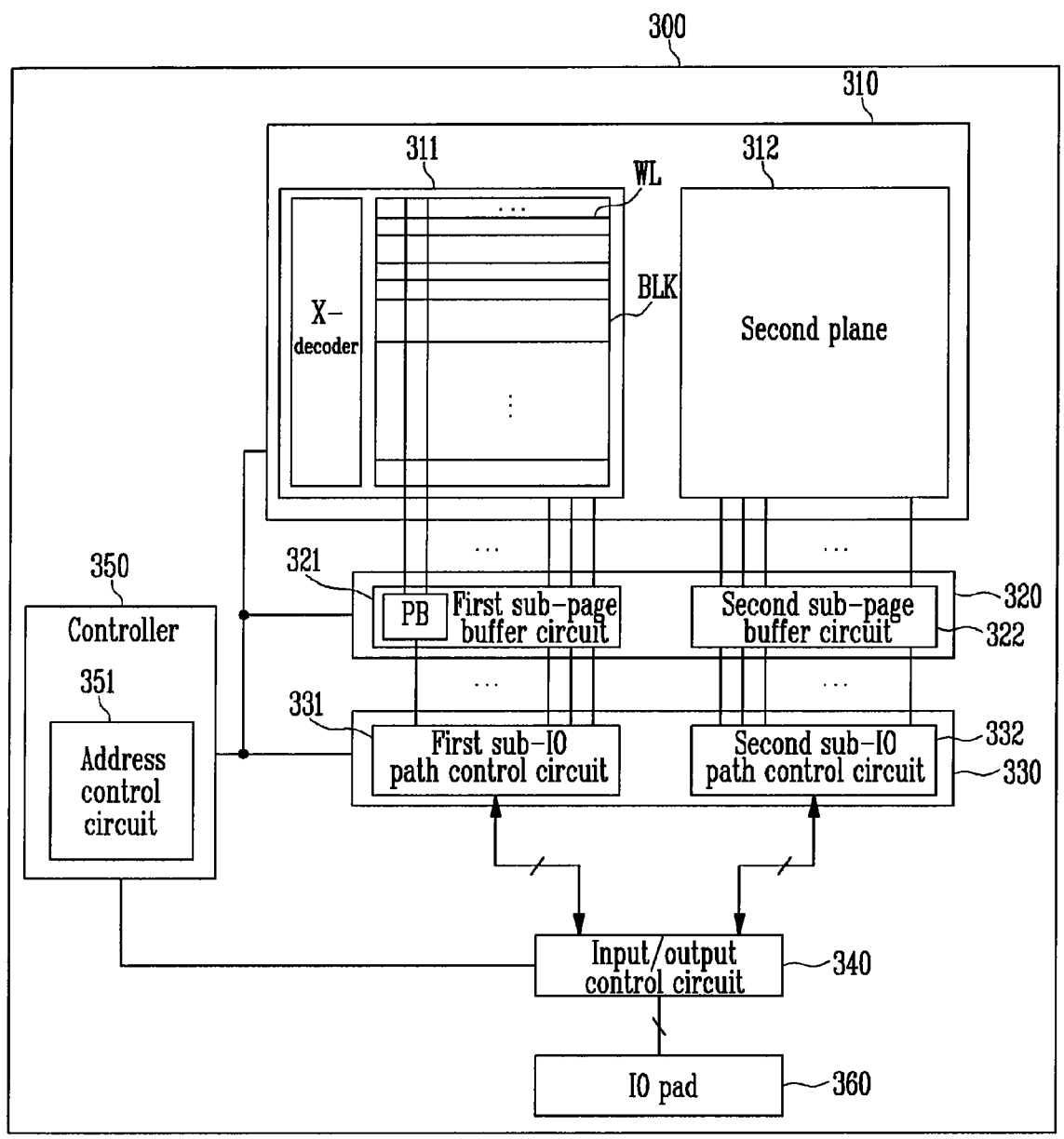
FIG. 3A is a block diagram illustrating an NAND flash memory device according to one example embodiment of the present invention.

FIG. 3A is a block diagram illustrating a NAND flash memory device according to one example embodiment of the present invention. The NAND flash memory device 300 includes a plane circuit 310, a page buffer circuit 320, an input/output path control circuit 330, an input/output control circuit 340 and a controller 350.

The plane circuit 310 includes a first plane 311 and a second plane 312. Each of the planes 311 and 312 includes a memory cell array having memory blocks BLK, wherein each of the memory blocks BLK has memory cells coupled to word lines WL and bit lines BL. In addition, each of the planes 311 and 312 includes an X decoder for selecting the memory block BLK and the word line WL in accordance with an input address.

The page buffer circuit 320 includes a first sub-page buffer circuit 321 coupled to the first plane 311 and a second sub-page buffer circuit 322 coupled to the second plane 312. Additionally, the page buffer circuit 320 has a plurality of page buffers PB coupled to a pair of bit lines of the memory cell array in the plane circuit 310 and for programming or reading data. Each of the first and second sub-page buffer circuit includes at least one page buffer.

The input/output path control circuit 330 includes a first sub-IO path control circuit 331 for controlling input data/output data of the first sub-page buffer circuit 321 and a second sub-IO path control circuit 332 for controlling input data/output data of the second sub-page buffer circuit 322.

The input/output control circuit 340 couples data lines of the first sub-IO path control circuit 331 and second sub-IO path control circuit 332 (selected in accordance with a plane select signal) to an IO pad 360. In addition, the input/output control circuit 340 transmits command and address information, etc inputted from the IO pad 360 to the controller 350.

The controller 350 includes an address controller 351 outputting internal addresses.

Figure 3B:
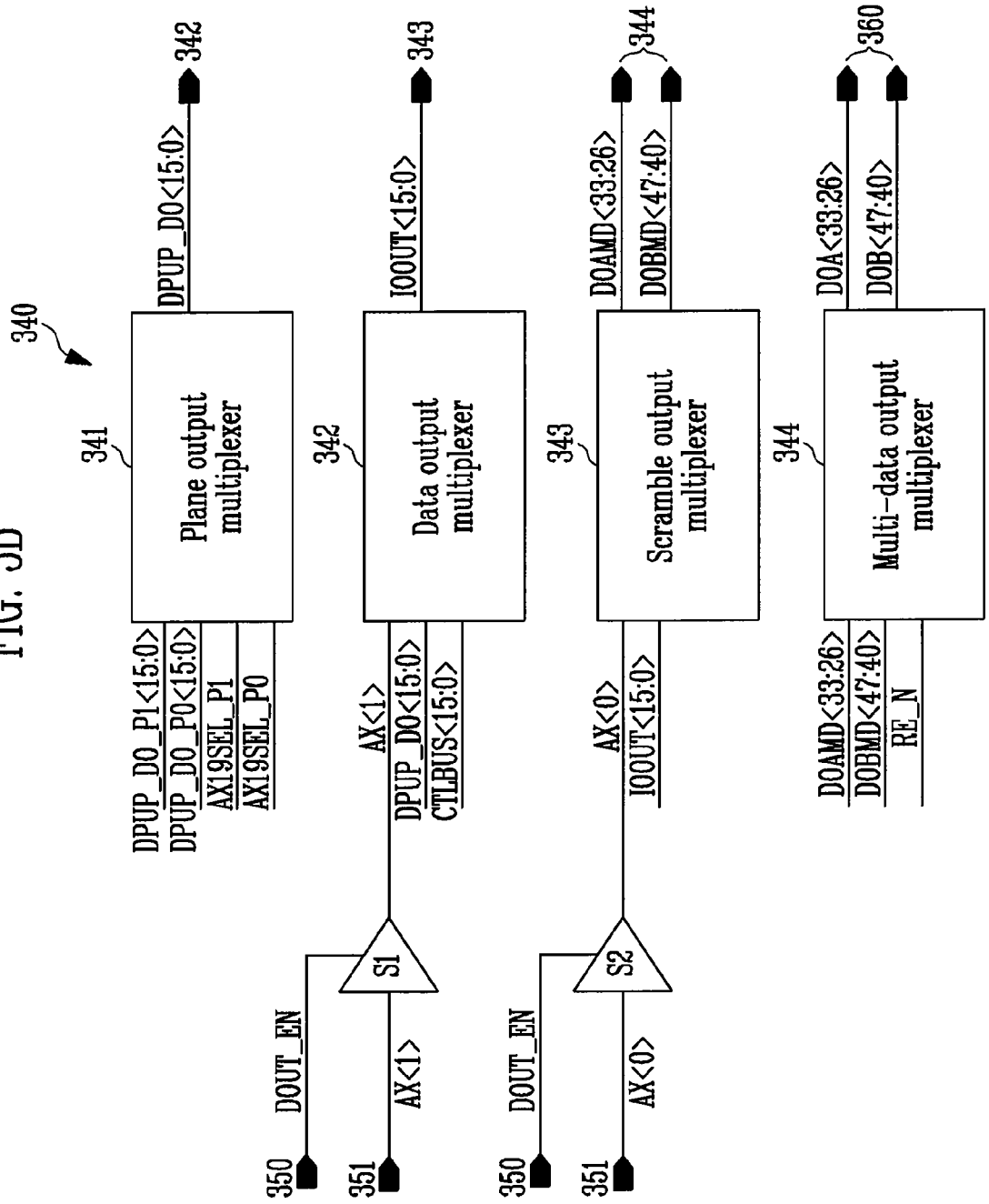
FIG. 3B is a block diagram illustrating the input/output control circuit in FIG. 3A.

FIG. 3B is a block diagram illustrating the input/output control circuit 340 in FIG. 3A. The input/output control circuit 340 includes a plane output multiplexer 341 for output of data, a data output multiplexer 342, a scramble output multiplexer 343, a multi-data output multiplexer 344, a first switch S1 and a second switch S2.

The plane output multiplexer 341 outputs data in accordance with a plane select signal for selecting the first and second planes 311 and 312 included in the NAND flash memory device 300. That is, the plane output multiplexer 341 receives data outputted from each of the planes 311 and 312 through data buses DPUP_DO_P0<15:0> and DPUP_DO_P1<15:0>, and outputs plane data DPUP_DO<15:0> in accordance with the plane select signal AX19SEL_P0 or AX19SEL_P1.

The data output multiplexer 342 transmits the plane data DPUP_DO<15:0> outputted from the plane output multiplexer 341 to an input/output data bus IOOUT<15:0> in accordance with a first internal address AX<1>. Additionally, the data output multiplexer 342 may output a value of a control bus CTLBUS<15:0> to the input/output data bus IOOUT<15:0> in a specific mode such as a test mode.

The scramble output multiplexer 343 divides the data of 16 bits transmitted through the input/output data bus IOUT<15:0> to two 8 bit buses DOAMD<33:26> and DOBMD<47:40> in accordance with a second internal address AX<0>.

The multi-data output multiplexer 344 transmits the data provided to the output path buses DOAMD<33:26> and DOBMD<47:40> through the scramble output multiplexer 343 to output pads DOA and DOB in accordance with a control signal RE_N.

In the NAND flash memory device of the present embodiment, data are read from the plane selected in accordance with a read command. Data read from a plane (or read data) are inputted to the plane output multiplexer 341 through the data buses DPUP_DO_P0<15:0> and DPUP_DO_P1<15:0>.

The plane output multiplexer 341 outputs the data as the plane data DPDU_DO<15:0> (or "output data"), wherein the output data are selected in accordance with the plane select signal.

The plane data DPDU_DO<15:0> are inputted to the data output multiplexer 342.

The data output multiplexer 342 outputs the plane data DPDU_DO<15:0> inputted in accordance with the first internal address AX<1> to the input/output data bus IOOUT<15:0>.

The data outputted to the input/output data bus IOOUT<15:0> are inputted to the scramble output multiplexer 343.

The scramble output multiplexer 343 divides the data transmitted through the input/output data bus IOOUT<15:0> to the output pad buses DOAMD<33:26> and DOBMD<47:40> in accordance with the second internal address AX<0>. Here, since the input/output data bus IOOUT<15:0> and the output path bus DOAMD<33:26> or DOBMD<47:40> have respectively 16 bits and 8 bits, the data transmitted through the input/output data bus IOOUT<15:0> are outputted to two output pads A and B (not shown). In other implementations, the data may be outputted to more than two output pads.

The data transmitted through the output path buses DOAMD<33:26> and DOBMD<47:40> are provided to the output pads A and B, respectively, through the multi-data output multiplexer 344 in accordance with the read control signal RE_N. Here, numbers <33:26> and <47:40> of the output pads A and B are pin numbers of the output pads A and B.

In a conventional data output circuit, the multiplexers 341 to 344 operates continuously in accordance with the first and second internal addresses AX<1> and AX<0> in a data input interval even when data are not outputted. Particularly, the data output multiplexer 342 switches the plane data DPUP_DO<15:0> and a signal of the control bus CTL-BUS<15:0> in accordance with the first internal address AX<1> even though the data are not outputted, thereby coupling to the input/output data bus IOOUT<15:0>. In addition, the scramble output multiplexer 343 switches coupling of the input/output data bus IOOUT<15:0> and the output path buses DOAMD<33:26> and DOBMD<47:40> in accordance with the second internal address AX<0>.

To prevent this unnecessary operation, the input/output control circuit 340 has the first switch S1 and the second switch S2 for controlling the first and second internal addresses AX<1> and AX<0> inputted from the address controller 351. In other words, the first switch S1 and the second switch S2 are switched in accordance with a data output enable signal DOUT_EN, thereby transmitting the first internal address AX<1> and the second internal address AX<0> to the data output multiplexer 342 and the scramble output multiplexer 343, respectively. Here, the data output enable signal DOUT_EN is inputted from the controller 350.

Accordingly, the input/output control circuit 340 disables the data output enable signal DOUT_EN during the data input interval, thereby controlling the switches S1 and S2 so that the internal addresses AX<1> and AX<0> are not inputted to the data output multiplexer 342 and the scramble output multiplexer 343.

In this case, the data output multiplexer 342 and the scramble output multiplexer 343 are not operated. Hence, the data output circuit may conserve power.

In one example embodiment of the present invention, the switches S1 and S2 may be implemented by using a three phase buffer circuit instead of the above switching circuit. Other types of switching device may also be used according to application.

Figure 4:
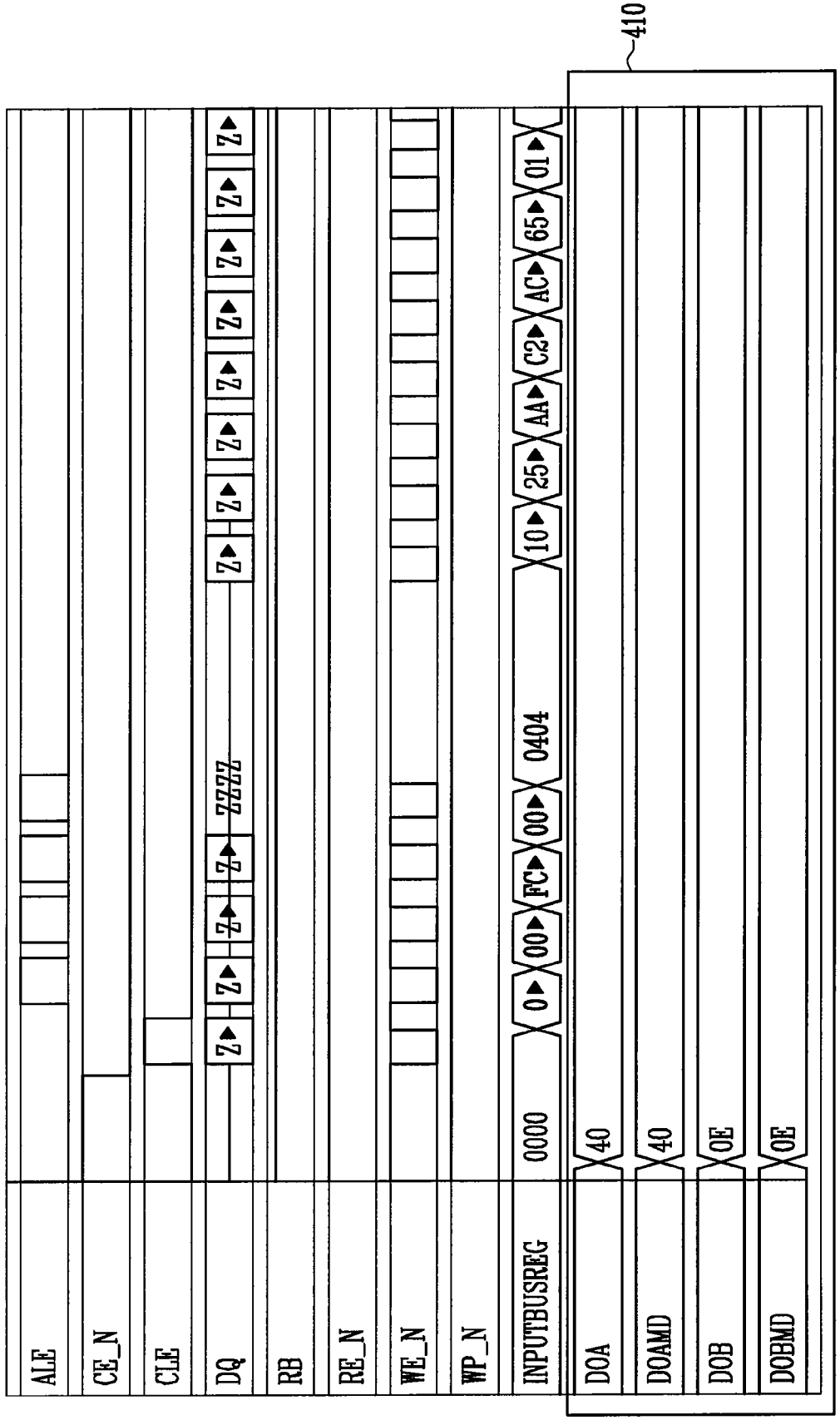
FIG. 4 is a timing diagram illustrating an operation of the data output circuit according to one example embodiment of the present invention.

An operation of the data output circuit in accordance with the data output enable signal DOUT_EN is shown in FIG. 4.

FIG. 4 is a timing diagram illustrating an operation of the data output circuit according to one example embodiment of the present invention. As shown in a block 410, output of the output pads A and B are not switched. This is because the data output enable signal DOUT_EN is maintained at a low level during the data input interval.

In the case that the data output enable signal DOUT_EN is inputted with a low level, the switches S1 and S2 do not output the internal addresses AX<1> and AX<0>, but continues to output the previously output values. As a result, the data output multiplexer 342 and the scramble output multiplexer 343 of the data output circuit do not perform a switching operation.

The simulation results in FIG. 4 are based on a HL8GMLC flash memory device. In this case, current consumption is reduced by about 0.5 mA during the program operation.

In another example embodiment of the present invention, the data input circuit may not be operated by coupling a switching means (such as the switches S1 and S2) to a block related to input of data when the data are outputted Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A data input/output control circuit in a flash memory, the input/output control circuit comprising:
at least one switching unit configured to output one or more internal address signals during data output operation, and to stop outputting one or more internal address signals in accordance with a data output enable signal during data input operation of the flash memory; and
one or more data output circuits configured to output data in response to the internal address signals output from the switching unit during the data output operation,
wherein the data output circuits are not operated in response to the internal address signals of the switching unit during the data input operation of the flash memory.

2. The data input/output control circuit of claim 1, wherein the switching unit is a three phase inverter circuit configured to output the internal address signals when the data output enable signal is enabled and output a constant output value when the data output enable signal is disabled,
wherein the data pad is an input/output pad.

3. The data input/output control circuit of claim 1, wherein the data output circuit includes:

a plane output multiplexer configured to select one of planes in accordance with a first control signal and output data of the selected plane;
a data output multiplexer configured to output selectively an output signal and control data of the plane output multiplexer in accordance with a second control signal;
a scramble output multiplexer configured to output data outputted from the data output multiplexer into one or more data buses in accordance with a third control signal; and
a multi-data output multiplexer configured to transmit a signal of the data bus outputted from the scramble output multiplexer to the data pad in accordance with a data read signal,
wherein the data pad is used to output data.

4. The data input/output control circuit of claim 3, wherein the first control signal is a plane select signal.

5. The data input/output control circuit of claim 3, wherein the second control signal is a first internal address signal inputted in accordance with the data output enable signal.

6. The data input/output control circuit of claim 3, wherein the third control signal is a second internal address signal inputted in accordance with the data output enable signal.

7. The data input/output control circuit of claim 1, where the data output enable signal is disabled during an input operation of data.

8. The data input/output control circuit of claim 1, wherein the input/output control circuit is provided between an input/output path control circuit and a data pad and is configured to process data flow between the input/output path control circuit and the data pad.

9. A circuit in a flash memory device comprising:
a data input path through which data are inputted;
a data output path through which data are outputted;
a controller configured to cut off the data input path and activate the data output path during a data output interval of the flash memory device, and activate the data input path and cut off the data output path during a data input interval of the flash memory device; and
a switching unit configured to switch the data input path and the data output path in accordance with control of the controller,
wherein the switching unit is a three phase inverter circuit for outputting an internal address inputted to the data output path when data are outputted and cut off output of the internal address when data are inputted.

10. A circuit in a flash memory device comprising:
a data input path through which data are inputted;
a data output path through which data are outputted;
a controller configured to cut off the data input path and activate the data output path during a data output interval of the flash memory device, and activate the data input path and cut off the data output path during a data input interval of the flash memory device; and
a switching unit configured to switch the data input path and the data output path in accordance with control of the controller,
wherein the switching unit is a three phase inverter circuit for outputting an internal address inputted to the data input path when data are inputted and cut off output of the internal address when data are outputted.

11. A flash memory comprising:
first and second sub-page buffer circuits coupled to first and second planes, respectively;
first and second sub-IO path control circuits to control data being input and output to the first and second sub-page buffer circuits, the first and second sub-IO path control circuits being associated with the first and second sub-page buffer circuits, respectively;
an input/output control circuit configured to process data flow between an input/output pad and the first and second sub-IO path control circuits, wherein the input/output control circuit includes a first data output circuit and a first switch circuit coupled to the first data output circuit,
wherein the first switching unit is configured to output a first address signal according to a first data output enable signal, and
wherein the input/output control circuit is configured to disable the first data output enable signal during a data input period, so that the first address signal is not inputted to the first data output circuit.

12. The flash memory of claim 11, wherein the first data output circuit is a data output multiplexer that is configured to output first data when the first address signal is received from the first switching unit.

13. The flash memory of claim 11, wherein the input/output control circuit further includes a second data output circuit and a second switch circuit coupled to the second data output circuit,
wherein the second switching unit is configured to output a second address signal according to a second data output enable signal, and
wherein the input/output control circuit is configured to disable the second data output enable signal during the data input period, so that the second address signal is not inputted to the second data output circuit.

14. The flash memory of claim 13, wherein the second data output circuit is configured to output the second data when the second address signal is received from the second switching unit.

15. The flash memory of claim 13, wherein the second data output circuit is a scramble output multiplexer.

* * * * *